(12) United States Patent
Nakaki

(10) Patent No.: US 10,026,748 B2
(45) Date of Patent: Jul. 17, 2018

(54) STACKED TYPE SEMICONDUCTOR MEMORY DEVICE AND METHOD FOR MANUFACTURING SAME

(71) Applicant: TOSHIBA MEMORY CORPORATION, Minato-ku (JP)

(72) Inventor: Hiroshi Nakaki, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/255,913

(22) Filed: Sep. 2, 2016

(65) Prior Publication Data

US 2017/0263628 A1    Sep. 14, 2017

Related U.S. Application Data

(60) Provisional application No. 62/305,561, filed on Mar. 9, 2016.

(51) Int. Cl.
   *G11C 11/34*     (2006.01)
   *G11C 16/04*     (2006.01)
   (Continued)

(52) U.S. Cl.
   CPC .. *H01L 27/11582* (2013.01); *H01L 27/11565* (2013.01)

(58) Field of Classification Search
   CPC ........... H01L 27/11582; H01L 27/1157; H01L 23/5226; H01L 23/528; H01L 29/7926;
   (Continued)

(56) References Cited

U.S. PATENT DOCUMENTS

| | | | | |
|---|---|---|---|---|
| 6,353,242 | B1 * | 3/2002 | Watanabe | G11C 16/0483 257/208 |
| 8,350,326 | B2 * | 1/2013 | Fukuzumi | H01L 21/28282 257/316 |

(Continued)

FOREIGN PATENT DOCUMENTS

| JP | 2007-266143 | 10/2007 |
|---|---|---|
| JP | 2014-187321 | 10/2014 |
| JP | 2015-99923 | 5/2015 |

*Primary Examiner* — Marcos D Pizarro
*Assistant Examiner* — Nelson Garces
(74) *Attorney, Agent, or Firm* — Oblon, McClelland, Maier & Neustadt, L.L.P.

(57) ABSTRACT

According to the embodiment, the semiconductor device includes: a stacked body; first interconnect and a second interconnect; a first columnar portion, a second columnar portion, a third columnar portion, and a fourth columnar portion; a first intermediate interconnect; a first connection portion; a second connection portion; and a second intermediate interconnect. The stacked body includes a plurality of electrode layers. The first interconnect and the second interconnect are provided on the stacked body, and extend in a first direction crossing a stacking direction of the stacked body. The first intermediate interconnect is electrically connected to the first interconnect, the first columnar portion, and the second columnar portion. The second intermediate interconnect is provided at a height different from a height of the first intermediate interconnect, and is electrically connected to the second interconnect, the third columnar portion, and the fourth columnar portion.

17 Claims, 14 Drawing Sheets

(51) Int. Cl.
*H01L 27/115* (2017.01)
*H01L 29/792* (2006.01)
*H01L 29/51* (2006.01)
*H01L 29/423* (2006.01)
*H01L 29/66* (2006.01)
*H01L 29/788* (2006.01)
*H01L 27/11582* (2017.01)
*H01L 27/11565* (2017.01)

(58) Field of Classification Search
CPC . H01L 23/5283; H01L 27/1156; G11C 16/10;
G11C 16/26; G11C 16/0483
USPC .................................................. 257/319–329
See application file for complete search history.

(56) References Cited

U.S. PATENT DOCUMENTS

| | | |
|---|---|---|
| 8,797,777 B2 | 8/2014 | Hishida et al. |
| 8,884,357 B2 | 11/2014 | Wang et al. |
| 9,129,861 B2* | 9/2015 | Seol .................. H01L 29/42332 |
| 2007/0252201 A1 | 11/2007 | Kito et al. |
| 2011/0233505 A1* | 9/2011 | Nitta ....................... H01L 27/24 |
| | | 257/3 |
| 2011/0284947 A1 | 11/2011 | Kito et al. |
| 2011/0287597 A1 | 11/2011 | Kito et al. |
| 2014/0284685 A1 | 9/2014 | Shimojo et al. |
| 2015/0145021 A1* | 5/2015 | Jang ................... H01L 27/1158 |
| | | 257/324 |
| 2015/0372006 A1 | 12/2015 | Kito et al. |

* cited by examiner

STACKED TYPE SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/305,561 filed on Mar. 9, 2016; the entire contents of which are incorporated herein by reference.

FIELD

Embodiments described herein relate generally to a semiconductor device and a method for manufacturing the same.

BACKGROUND

A memory device having a three-dimensional structure has been proposed in which a memory hole is made in a stacked body in which multiple electrode layers are stacked, and a charge storage film and a semiconductor film are provided to extend in a stacking direction of the stacked body inside the memory hole. The memory device includes multiple memory cells connected in series between a drain-side select transistor and a source-side select transistor. The electrode layers of the stacked body are gate electrodes of the drain-side select transistor, the source-side select transistor, and the memory cell. A bit line is provided above the stacked body. The bit line is sometimes commonly electrically connected to two drains of the drain-side select transistors via an intermediate interconnect. During the forming of the intermediate interconnect, the degree of difficulty of processing may be high.

DETAILED DESCRIPTION

Figure 1:
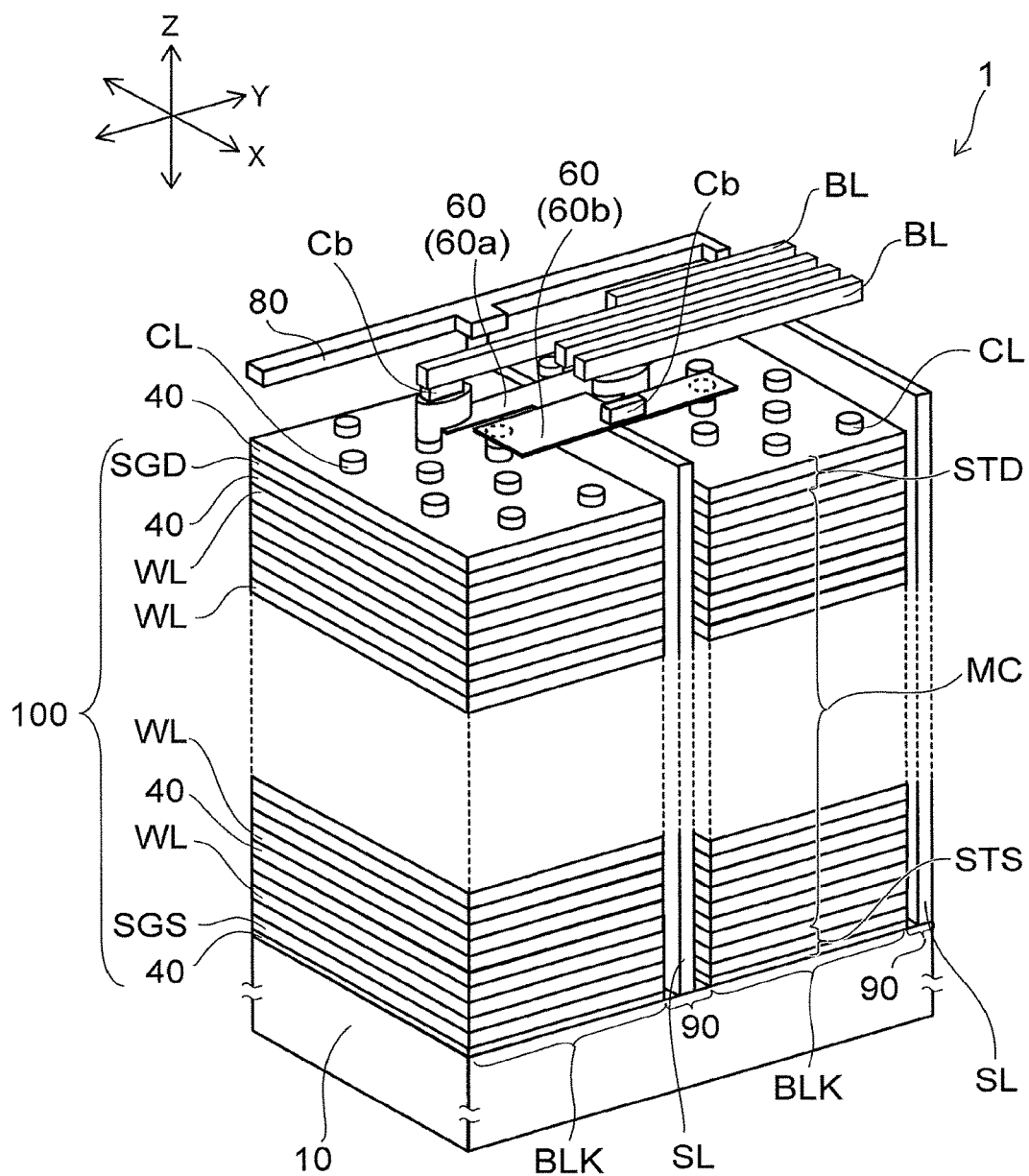
FIG. 1 is a schematic perspective view of a memory cell array of an embodiment.

According to the embodiment, the semiconductor device includes: a stacked body; first interconnect and a second interconnect; a first columnar portion, a second columnar portion, a third columnar portion, and a fourth columnar portion; a first intermediate interconnect; a first connection portion; a second connection portion; and a second intermediate interconnect. The stacked body includes a plurality of electrode layers stacked with an insulator interposed. The first interconnect and the second interconnect are provided on the stacked body, and extend in a first direction crossing a stacking direction of the stacked body. The first columnar portion, the second columnar portion, the third columnar portion, and the fourth columnar portion are provided in the stacked body, and extend in the stacking direction. The first intermediate interconnect is provided between the first interconnect and the stacked body, extends in the first direction, and is electrically connected to the first interconnect, the first columnar portion, and the second columnar portion. The first connection portion is in contact with the first columnar portion and the first intermediate interconnect. The second connection portion is in contact with the second columnar portion and the first intermediate interconnect. The second intermediate interconnect is provided between the second interconnect and the stacked body, extends in the first direction, is provided at a height different from a height of the first intermediate interconnect, and is electrically connected to the second interconnect, the third columnar portion, and the fourth columnar portion.

Embodiments will now be described with reference to the drawings. In the respective drawings, like members are labeled with like reference numerals. Semiconductor devices of the embodiments are semiconductor memory devices having memory cell arrays.

FIG. 1 is a schematic perspective view of a memory cell array 1 of the embodiment. In FIG. 1, two mutually-orthogonal directions parallel to a major surface of a substrate are taken as an X-direction (second direction) and a Y-direction (first direction). The XY plane is taken to be a planar direction of a stacked body 100. A direction orthogonal to both the X-direction and the Y-direction is taken as a Z-direction (the stacking direction of the stacked body 100).

As shown in FIG. 1, the semiconductor device of the embodiment includes the memory cell array 1. The memory cell array 1 is, for example, provided on the major surface of the substrate 10. The substrate 10 is, for example, a semiconductor substrate. The semiconductor substrate includes, for example, silicon. A conductivity type of the substrate 10 is, for example, p-type.

The memory cell array 1 includes the stacked body 100, a plurality of columnar portions CL, and a plurality of side wall portions 90. The stacked body 100 is provided on the major surface of the substrate 10. The stacked body 100 includes a plurality of electrode layers (SGS, WL, SGD) and a plurality of insulators 40. The plurality of electrode layers (SGS, WL, SGD) is stacked with the insulators 40 interposed. The electrode layer (SGS, WL, SGD) includes a conductive material. The conductive material includes, for example, tungsten. The insulator 40 may be insulating material being silicon oxide and so on, and may include air gap. The number of stacks of electrode layers (SGS, WL, SGD) is arbitrary.

The electrode layer SGS is a source-side select gate line. The electrode layer SGD is drain-side select gate line. The electrode layer WL is a word line. The source-side select gate line SGS is provided on the major surface of the substrate 10 via the insulator 40. A plurality of word lines WL is provided on the source-side select gate line SGS via the insulator 40. The drain-side select gate line SGD is provided on a top layer of the word lines WL via the insulator 40.

At least one of the source-side select gate lines SGS is used as a gate electrode of a source-side select transistor STS. At least one of the drain-side select gate lines SGD is used as a gate electrode of a drain-side select transistor STD. A plurality of memory cells MC is connected in series between the source-side select transistor STS and the drain-side select transistor STD. Each memory cell MC use one of the word lines WL as a gate electrode.

The side wall portion 90 is provided in the stacked body 100. The side wall portion 90 extends along the Z-direction and the X-direction. The side wall portion 90 separates the stacked body 100 into a plurality of regions in the Y-direction. The regions separated by the side wall portion 90 are called "block BLK". The source line SL is provided in the side wall portion 90. The source line SL includes a conductive material. The conductive material includes, for example, at least one of tungsten and titanium. The conductive material may include, for example, a stacked body formed of titanium and a titanium nitride film. The source line SL is electrically connected to the columnar portion CL via the substrate 10.

An upper portion interconnect 80 is disposed above the source line SL. The upper portion interconnect 80 extends in the Y-direction. The upper portion interconnect 80 is electrically connected to a plurality of source lines SL arranged along the Y-direction. The upper portion interconnect 80 is electrically connected to a peripheral circuit not shown.

The columnar portion CL is provided in the stacked body 100. The columnar portion CL extends in the Z-direction. The columnar portion CL is, for example, formed in a circular columnar configuration or an elliptical columnar configuration. The source-side select transistor STS, the drain-side select transistor STD, and the memory cell MC are disposed at the columnar portion CL.

A plurality of intermediate interconnects 60 (first intermediate interconnect 60a, second intermediate interconnect 60b: conductive line) and a plurality of bit lines BL are provided above the columnar portion CL. Each of the bit lines BL extends in the Y-direction, and is disposed from each other in the X-direction. One bit line BL is electrically connected to the columnar portion CL selected from the each block BLK one by one. In the embodiment, one bit line BL is electrically connected to two columnar portions CL via one intermediate interconnect 60. The two columnar portions CL are separated from each other by the side wall portion 90. Thus, compared to the case where one bit line BL is electrically connected to one columnar portion CL via one contact portion, the number of contact portions Cb may be reduced.

Figure 2:
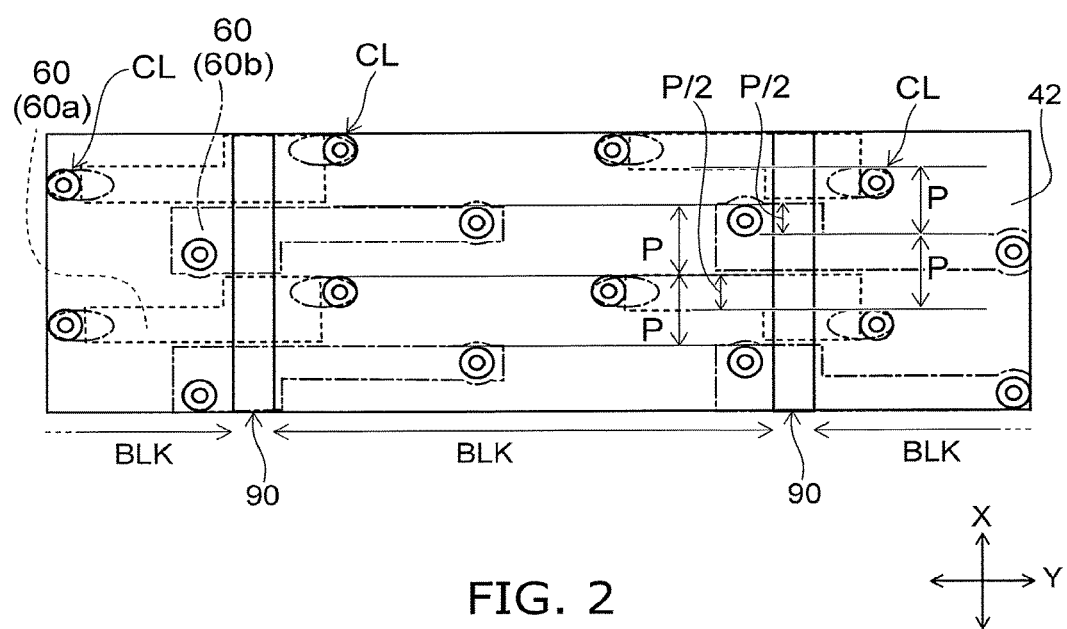
FIG. 2 is a schematic plane view of the semiconductor device of the embodiment.

FIG. 2 is a schematic plane view of the semiconductor device of the embodiment. FIG. 2 shows a plane on the stacked body 100. In FIG. 2, a broken line refers the first intermediate interconnect 60a, and an one-dot chain line refers the second intermediate interconnect 60b.

As shown in FIG. 2, the columnar portions CL are disposed, for example, in a staggered lattice configuration or a square lattice configuration in each of the blocks BLK separated by the side wall portion 90. In each of the blocks BLK, each of the columnar portions CL is disposed at an interval of a pitch P, along the X-direction. One columnar portion CL in one block BLK and another columnar portion CL in another block BLK adjacent to the one block BLK in the Y-direction are disposed to deviate from each other by P/n pitch (n is integer number being one or more) along the X-direction. In the embodiment, for example, the two columnar portions CL are disposed to deviate from each other by P/2 pitch.

Figure 3A:
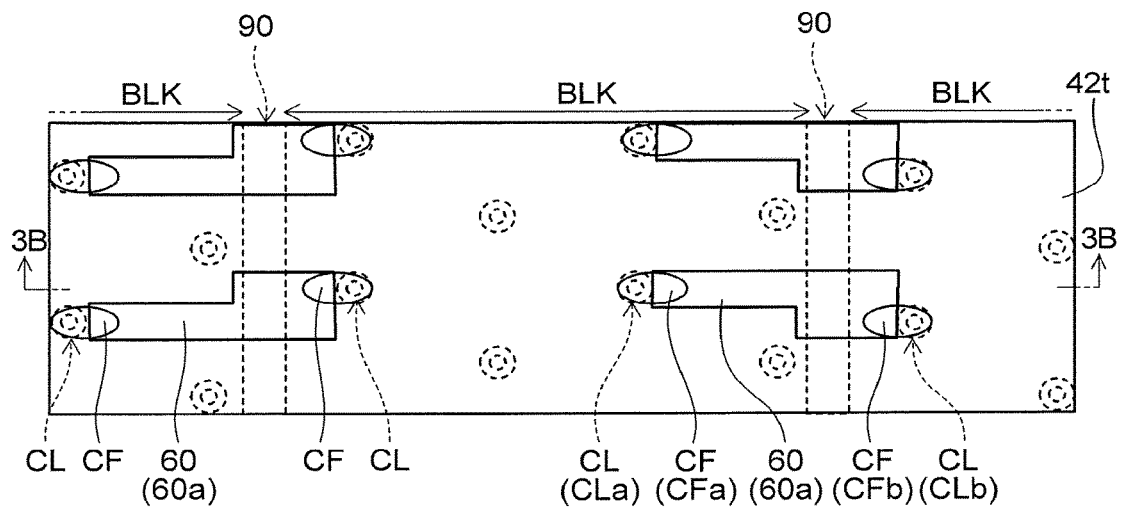
FIG. 3A is a schematic plane view of the semiconductor device of the embodiment.
Figure 3B:
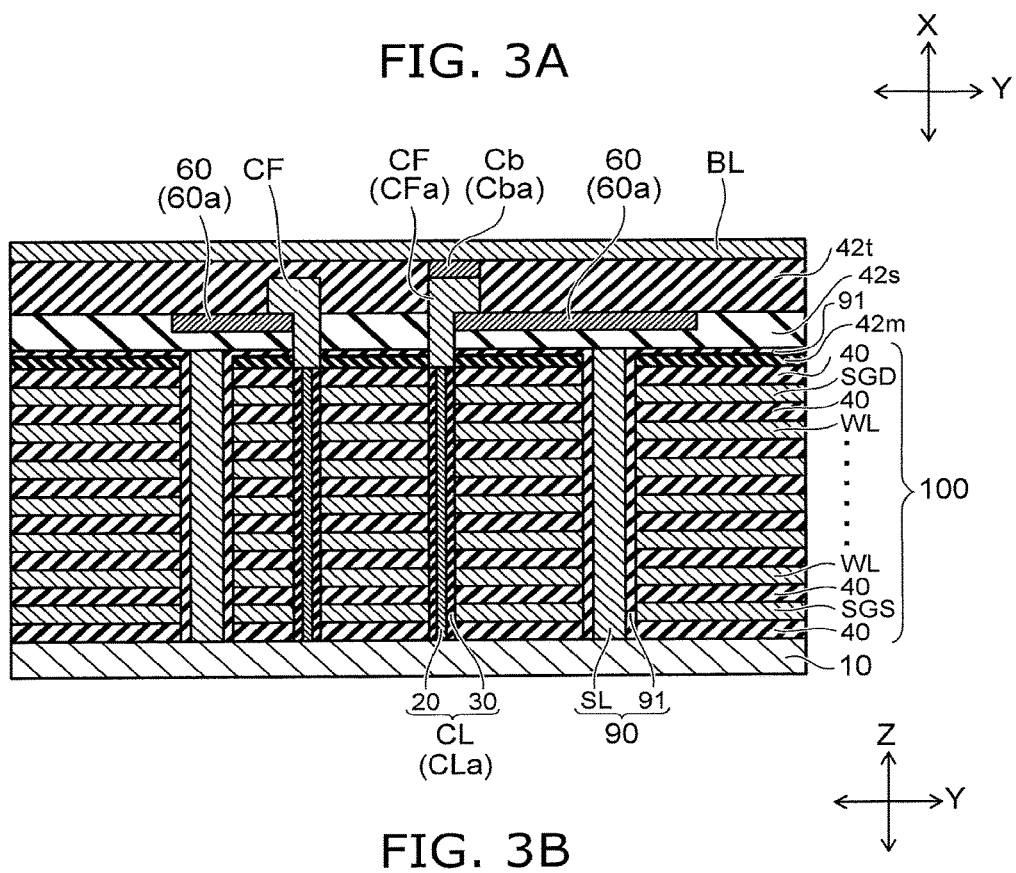
FIG. 3B is a schematic cross-sectional view along a 3B-3B line in FIG. 3A.

FIG. 3A is a schematic plane view of the semiconductor device of the embodiment. FIG. 3A shows a plane on the first intermediate interconnect 60a. FIG. 3B is a schematic cross-sectional view along a 3B-3B line in FIG. 3A.

As shown in FIG. 3A and FIG. 3B, a plurality of the first intermediate interconnects 60a is disposed along the X-direction and the Y-direction. The first intermediate interconnect 60a is provided in an insulator 42 and extends in the Y-direction. As viewed from the Z-direction, the first intermediate interconnect 60a is, for example, a hook shaped (L-shaped). As the reason for the first intermediate interconnect 60a having the hook shaped, for example, this is because the interference between the first intermediate interconnect 60a and a connection portion formed on the columnar portion CL adjacent to the first intermediate interconnect 60a is prevented.

The first intermediate interconnect 60a is electrically connected to two columnar portions CL (first columnar portion CLa, second columnar portion CLb) via two lower layer connection portions CF (first lower layer connection portion CFa, second lower layer connection portion CFb) (reference to FIG. 3A). The first intermediate interconnect 60a is electrically connected to one bit line BL via one first contact portion Cba (reference to FIG. 3B, the first contact portion CFa is not shown in FIG. 3A).

The lower layer connection portion CF is in contact with an upper surface of the columnar portion CL and an upper surface of the first intermediate interconnect 60a. In the embodiment, the lower layer connection portion CF is an elliptical configuration at a height higher than a height of the upper surface of the first intermediate interconnect 60a. The lower layer connection portion CF is a configuration excluding the area in contact with the upper surface of the first intermediate interconnect 60a from the elliptical configuration at a height not more than a height of the upper surface of the first intermediate interconnect 60a. By having the configuration, an contact area between the lower layer connection portion CF and the first intermediate interconnect 60a is increased, and the contact resistance may be reduced.

The first contact portion Cba is in contact with the lower layer connection portion CF and the bit line BL. Although not shown in FIG. 3B, the first contact portion Cba may be, for example, provided between the first intermediate interconnect 60a and the bit line BL. The first contact portion Cba, the first intermediate interconnect 60a and the lower layer interconnection portion CF include a conductive material. The conductive material includes, for example, tungsten.

Figure 4A:
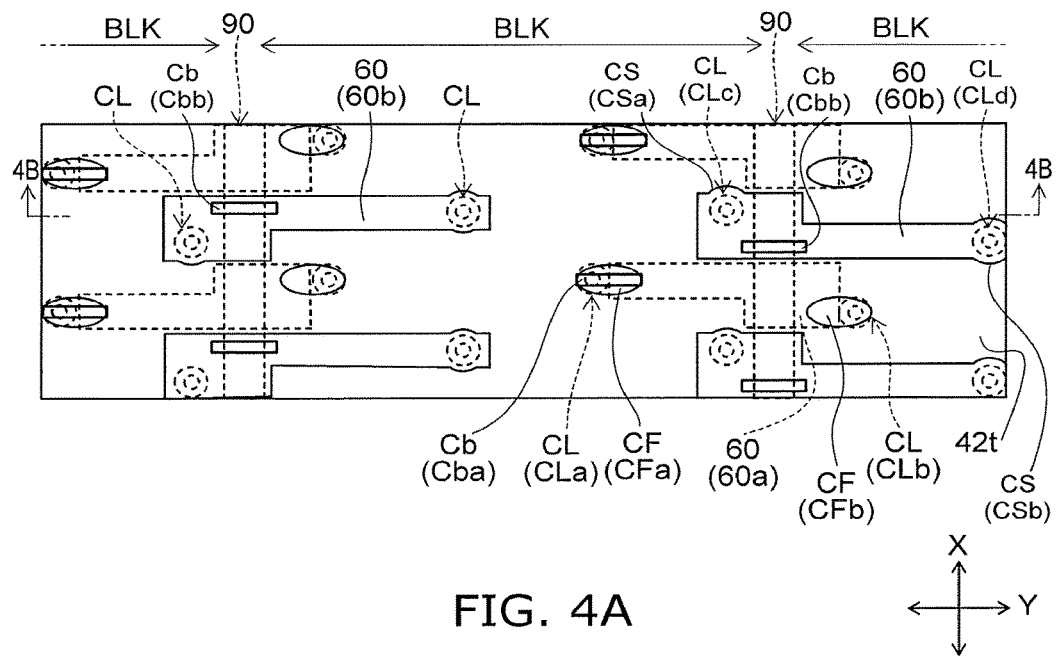
FIG. 4A is a schematic plane view of the semiconductor device of the embodiment.
Figure 4B:
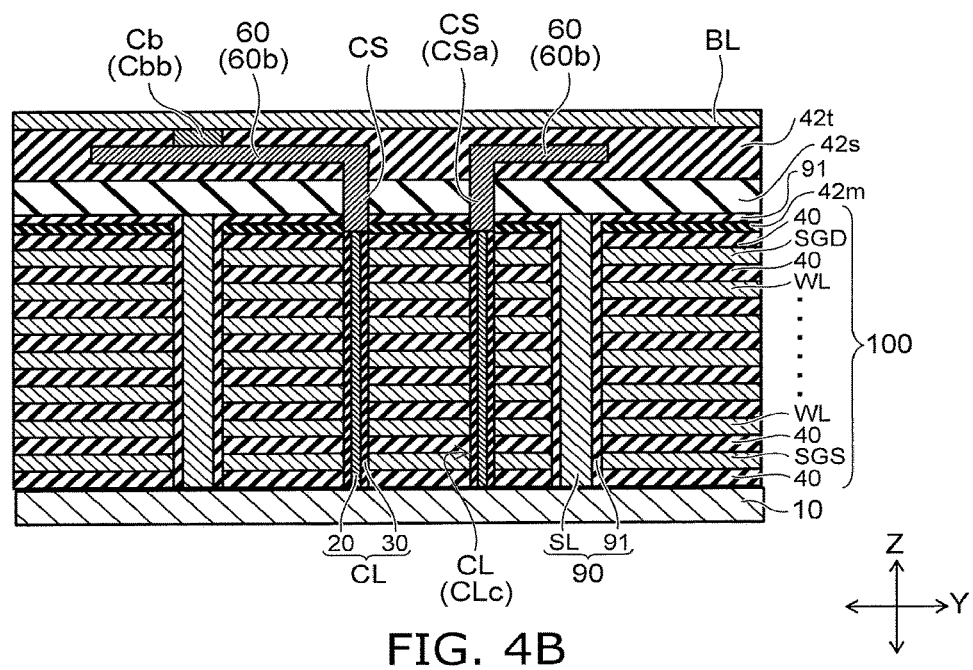
FIG. 4B is a schematic cross-sectional view along a 4B-4B line in FIG. 4A.

FIG. 4A is a schematic plane view of the semiconductor device of the embodiment. FIG. 4A shows a plane on the second intermediate interconnect 60b. FIG. 4B is a schematic cross-sectional view along a 4B-4B line in FIG. 4A.

As shown in FIG. 4A and FIG. 4B, a plurality of second intermediate interconnects 60b is provided along the X-direction and the Y-direction. The second intermediate interconnects 60b are, for example, alternately disposed with the first intermediate interconnects 60a along the X-direction. The second intermediate interconnect 60b is provided in the insulator 42t, and extends in the Y-direction. The second intermediate interconnect 60b is provided at a height than the height of the first intermediate interconnect 60a. As viewed from the Z-direction, the second intermediate interconnect 60b is, for example, the hook shaped. Here, "height" refers to the height in the Z-direction and refers to the position being higher from the substrate 10 toward the stacked body 100.

Each of the second intermediate interconnect 60b is electrically connected respectively to two columnar portions CL (third columnar portion CLc, fourth columnar portion CLd) via two upper layer connection portions CS (third connection portion CSa, fourth connection portion CSb).

Each of the second intermediate interconnects 60*b* is electrically connected respectively to one bit line BL via one second contact portion Cbb.

The upper layer connection portion CS is in contact with the upper surface of the columnar portion CL. The upper layer connection portion CS is the columnar configuration and is integrally provided with the second intermediate interconnect 60*b*. Thus, also in the YZ cross-section, the second intermediate interconnect 60*b* is the L-shaped. As viewed from the Z-direction, the upper layer connection portion CS overlaps the second intermediate interconnect 60*b* and the columnar portion CL.

The second contact portion Cbb is in contact with the second intermediate interconnect 60*b* and the bit line BL. The second contact portion Cbb, the second intermediate interconnect 60*b*, and the upper layer connection portion CS include a conductive material. The conductive material includes, for example, tungsten.

Figure 5A:
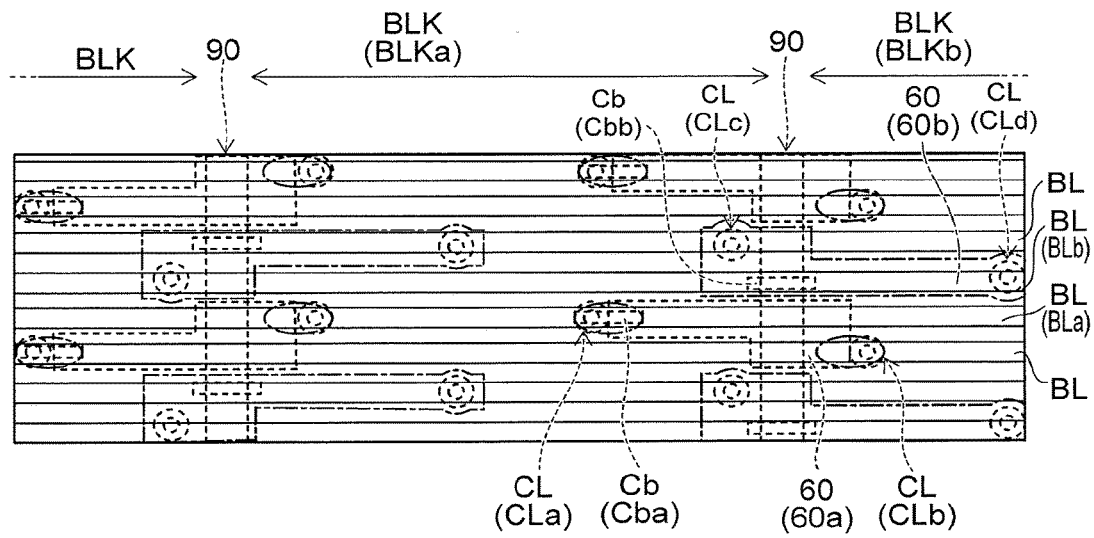
FIG. 5A is a schematic plane view of the semiconductor device of the embodiment.

FIG. 5A is a schematic plane view of the semiconductor device of the embodiment. FIG. 5A shows a plane view on the bit line BL.

As shown in FIG. 5A, the first columnar portion CLa and the third columnar portion CLc are provided in a first block BLKa, and the second columnar portion CLb and the fourth columnar portion CLd are provided in a second block BLKb. As viewed from the Z-direction, the first columnar portion CLa to the fourth columnar portion CLd are arranged in order of the first columnar portion CLa, the third columnar portion CLc, the second columnar portion CLb, and the fourth columnar portion CLd along the Y-direction, and in order of the second columnar portion CLb, the first columnar portion CLa, the fourth columnar portion CLd, and the third columnar portion CLc along the X-direction. At this time, as viewed from the Z-direction, a first bit line BLa is electrically connected to the first columnar portion CLa and the second columnar portion CLb, overlaps the first columnar portion CLa, and is separated from the second columnar portion CLb. As viewed from the Z-direction, a second bit line BLb is electrically connected to the third columnar portion CLc and the fourth columnar portion CLd, overlaps the fourth columnar portion CLd, and is separated from the third columnar portion CLc.

Ordinarily, each of the columnar portions CL in two blocks BLK adjacent in the Y-direction is disposed in a straight line in the Y-direction. In the case, in order to form the intermediate interconnect 60, two patterns of the intermediate interconnects 60 adjacent in the Y-direction must be bent in the X-direction, and be deviated from each other. In the case where each of the columnar portions CL is disposed by the pitch P along the X-direction, this is because each of the bit lines BL is, for example, disposed by a half pitch P/2. The two patterns of the intermediate interconnects 60 adjacent in the Y-direction are, for example, bent by P/4 in opposite directions to each other in the X-direction, and are deviated by a total of P/2. Thereby, the two columnar portions CL may be connected respectively to two bit lines BL, the two columnar portions CL disposed in series in the Y-direction in one block BLK. However, when the pattern of the intermediate interconnect 60 is formed by bending, the degree of difficulty of processing is high.

In contrast, in the embodiment, each of the columnar portions CL in two blocks BLK adjacent in the Y-direction is disposed to deviate by the P/n pitch, for example P/2 pitch, along the X-direction. By this disposing, the intermediate interconnect 60 may be formed by a simple pattern, for example, a straight pattern along the Y-direction, without bending the intermediate interconnect 60 in the X-direction.

Although the intermediate interconnect 60 of the embodiment has a "cut-out portion" to prevent interference of the each of the connection portions CF, CS, for example, is the hook shaped, the intermediate interconnect 60 may be not essentially bent in the X-direction. Therefore, the two columnar portions CL may be electrically connected to the one bit line BL via the intermediate interconnect 60 having a pattern being simple and easily processed. Therefore, the degree of difficulty of processing of the intermediate interconnect 60 may be reduced.

Further, in the embodiment, the second intermediate interconnect 60*b* is provided at a height higher than the height of the first intermediate interconnect 60*a*. Thus, a distance between the intermediate interconnects 60 adjacent along the X-direction is long compared to the case where the intermediate interconnects are disposed at a same height each other. Thereby, a flexibility of a layout of the intermediate interconnect 60 is improved.

Further, in the embodiment, the contact portion Cb may be formed on the intermediate interconnect 60. Thus, an area of the contact portion Cb in contact with the bit line BL may be enlarged compared to the case where the contact portion is formed on the columnar portion. Thereby, a resistance between the contact portion Cb and the bit line BL may be reduced.

Figure 5B:
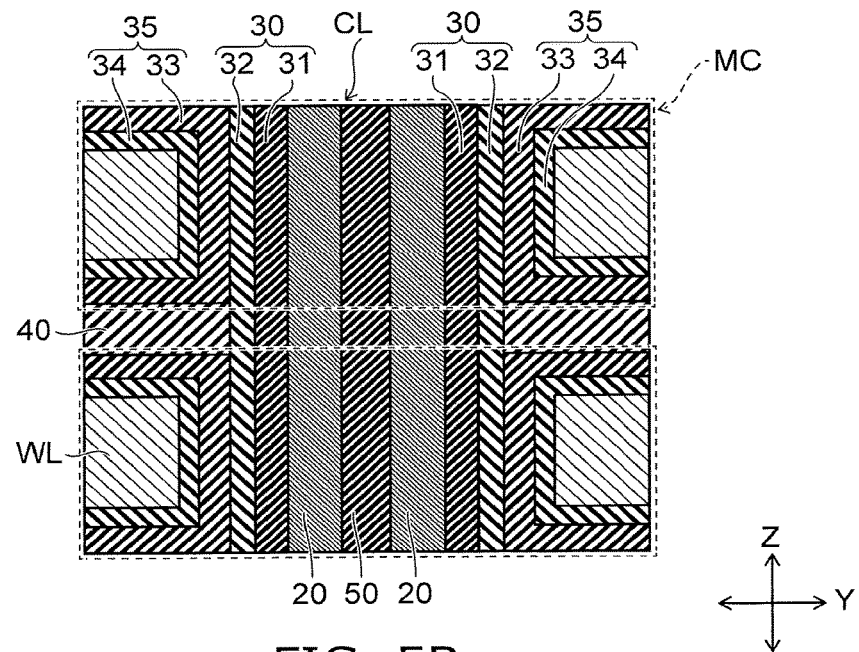
FIG. 5B is an enlarge cross-sectional view of a columnar portion of the embodiment.

FIG. 5B is an enlarge cross-sectional view of the columnar portion CL of the embodiment. In FIG. 5B, the word line WL of the electrode layer (SGS, WL, SGD) only will be described.

The columnar portion CL includes a memory film 30, a semiconductor body 20, and a core layer 50. The memory film 30, the semiconductor body 20, and the core layer 50 extend along the Z-direction. The memory film 30 is provided in contact with the stacked body 100. The memory film 30 is, for example, a tubular configuration. The semiconductor body 20 is provided on the memory film 30. The semiconductor body 20 includes, for example, silicon. The silicon is, for example, polysilicon made of amorphous silicon crystallized. The semiconductor body 20 is electrically connected to the substrate 10. The core layer 50 is provided on the semiconductor body 20. The core layer 50 has insulation. The core layer 50 includes, for example, silicon oxide. The core layer 50 is, for example, a columnar configuration.

The memory film 30 includes a tunneling insulating film 31 and a charge storage film 32. The tunneling insulating film 31 is provided between the semiconductor body 20 and the charge storage film 32.

The tunneling insulating film 31 includes, for example, silicon oxide or a stacked body formed of silicon oxide and silicon nitride. The tunneling insulating film 31 is a potential barrier between the charge storage film 32 and the semiconductor body 20. When a charge is injected from the semiconductor body 20 into the charge storage film 32 (writing operation) and a charge is emitted from the charge storage film 32 to the semiconductor body 20 (erasing operation), the charge tunnels through the tunneling insulating film 31.

The charge storage film 32 includes, for example, silicon nitride. The charge storage film 32 may include hafnium oxide other than the silicon nitride. The charge storage film 32 includes a trap site trapping a charge in the film. The charge is trapped in the trap site. A threshold value of the memory cell MC changes depending on presence or absence of the charge trapped at the trap site and the amount of trapped charge. Thereby, the memory cell MC holds information.

Although not shown in FIG. 5B, the memory film 30 may include, for example, a cover insulating film. The cover insulating film is provided between the charge storage film 32 and the insulator 40. The cover insulating film includes, for example, silicon oxide. The cover insulating film may be, for example, a stacked body formed of silicon oxide and aluminum oxide. For example, in the process forming the word line WL, the cover insulating film protects the charge storage film 32 from etching.

The stacked body 100 includes a blocking insulating film 35. The blocking insulating film 35 is provided between the word line WL and the insulator 40, and between the word line WL and the charge storage film 32. The blocking insulating film 35 suppresses, for example, back-tunneling of the charge from the word line WL into the charge storage film 32 in the erasing operation. The blocking insulating film 35 includes a first blocking insulating layer 33 and a second blocking insulating layer 34.

The first blocking insulating layer 33 is provided on a side of the memory film 30 in the blocking insulating film 35. The second blocking insulating layer 34 is provided between the first blocking insulating layer 33 and the word line WL. The first blocking insulating layer 33 includes a material different from the second blocking insulating layer 34. For example, the first blocking insulating layer 33 is an insulating material having a silicon oxide as a major component. The second blocking insulating layer 34 is an insulating material having a metal oxide as a major component. The metal is, for example, aluminum. The first blocking insulating layer 33 has a first relative dielectric constant. The second blocking insulating layer 34 has a second relative dielectric constant higher than the first relative dielectric constant.

Although not shown in FIG. 5B, for example, a barrier film may be provided between the blocking insulating film 35 and the word line WL. The barrier film includes, for example, titanium nitride, or includes titanium and titanium nitride.

Next, one example of a method for manufacturing the semiconductor device of the embodiment will be described. FIG. 6A to FIG. 14C are schematic views showing a method for manufacturing the semiconductor device of the embodiment. FIG. 6A, FIG. 7A, FIG. 8A, FIG. 9A, FIG. 10A, FIG. 11A, FIG. 12A, FIG. 13A, and FIG. 14A are schematic plane views of the semiconductor device of the embodiment. FIG. 6B, FIG. 7B, FIG. 8B, FIG. 9B, FIG. 10B, FIG. 11B, FIG. 12B, FIG. 13B, FIG. 14B, and FIG. 14C are schematic cross-sectional views of portions shown in an one-dot chain line of each of the plane views above describe.

Figure 6A:
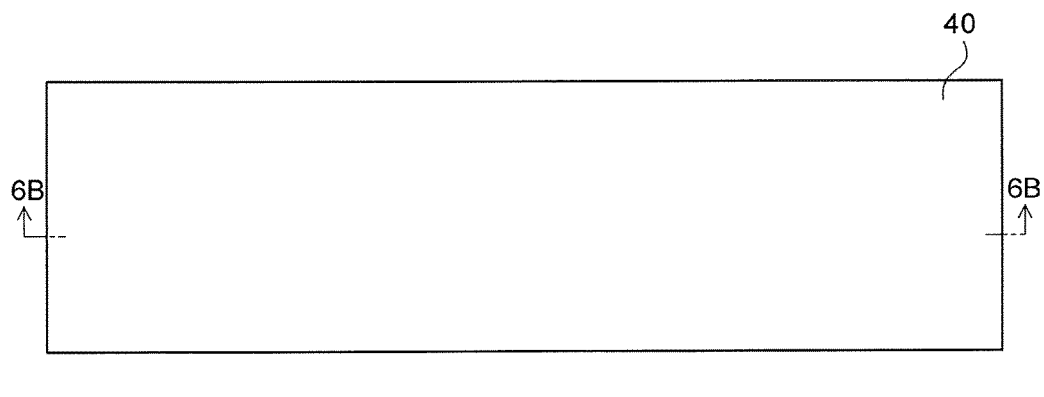
FIG. 6A to FIG. 14C are schematic views showing a method for manufacturing the semiconductor device of the embodiment.
Figure 6B:
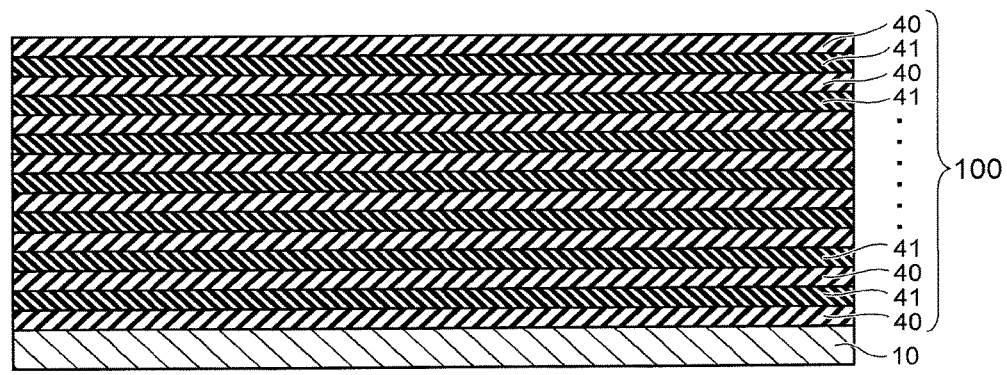

As shown in FIG. 6A and FIG. 6B, the stacked body 100 is formed on the substrate 10. The stacked body 100 is in a state where the replacement members 41 and the insulators 40 are alternately stacked. The replacement member 41 is a member to be replaced by the electrode layers (SGS, WL, SGD) later. The material of the replacement member 41 is selected from materials that can take an etching selection ratio to the insulator 40. For example, when a silicon oxide is selected as the insulator 40, a silicon nitride is selected as the replacement member 41.

Figure 7A:
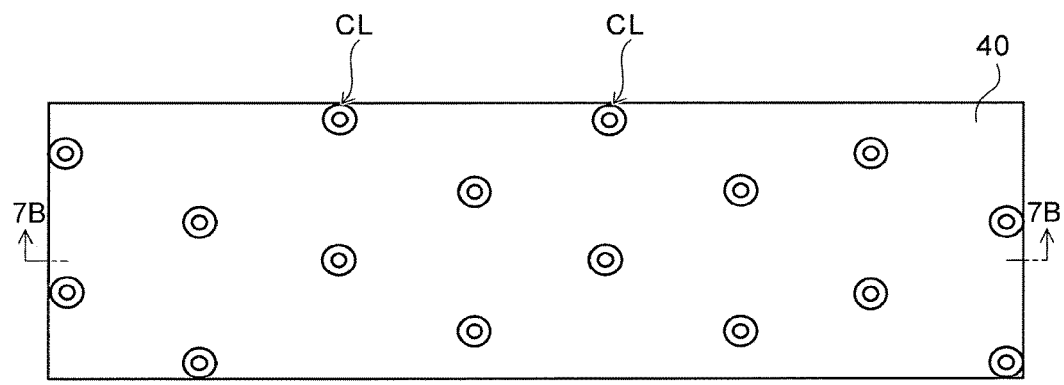
Figure 7B:
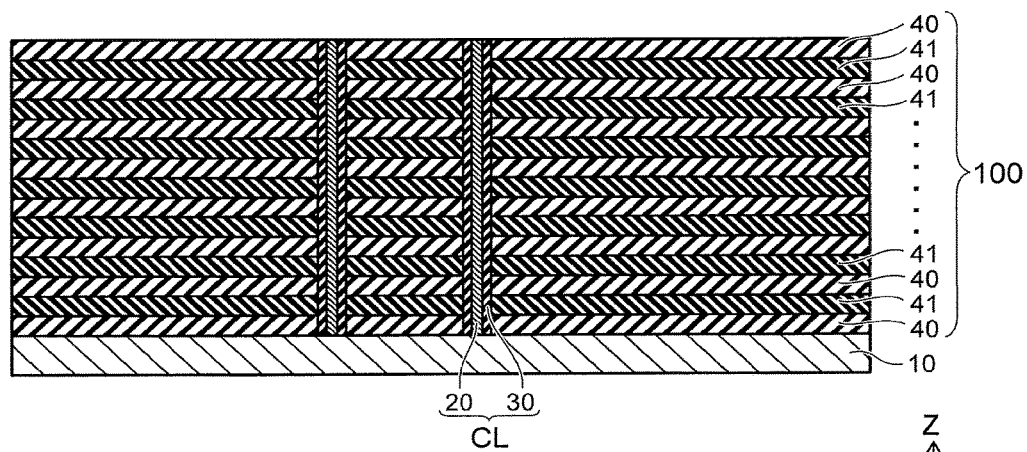

Next, as shown in FIG. 7A and FIG. 7B, the plurality of columnar portion CL is formed in the stacked body 100. The columnar portion CL is formed a hole. The hole is, for example, formed by using RIE method (Reactive Ion Etching), pierces the stacked body 100, and reaches the substrate 10. The columnar portion CL is formed in the hole MH after forming process of the memory film 30, forming process of the semiconductor body 20, and forming process of the core layer 50 (FIG. 7A and subsequent drawings not shown) shown in FIG. 5B. The semiconductor body 20 is in contact with the substrate 10.

Figure 8A:
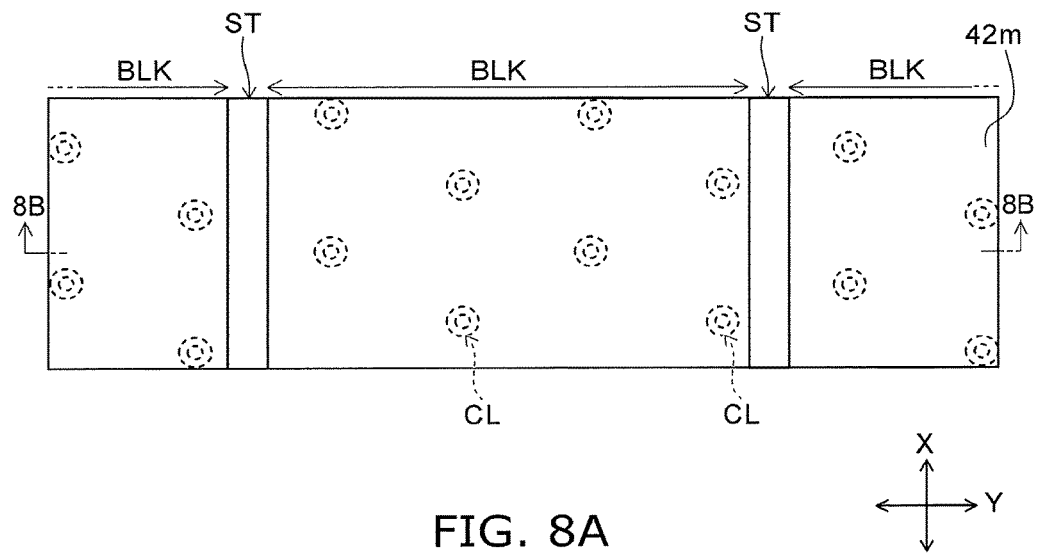
Figure 8B:
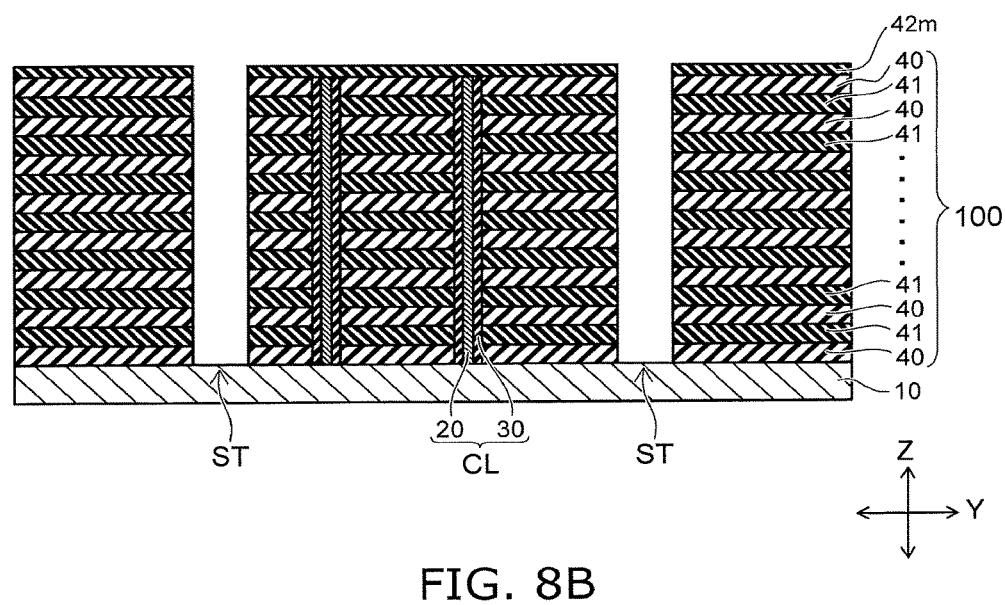

Next, as shown in FIG. 8A and FIG. 8B, the insulator 42m is formed on the stacked body 100 and the columnar portion CL. For example, silicon oxide is selected as the insulator 42m. After that, the slit ST is formed, pierces the stacked body 100, and reaches the substrate 10. The slit ST extends in the X-direction. Therefore, the stacked body 100 is separated to each block BLK. At this time, the columnar portions CL provided in the blocks BLK adjacent in the Y-direction are disposed to deviate by the P/n pitch, for example P/2 pitch, along the X-direction.

Figure 9A:
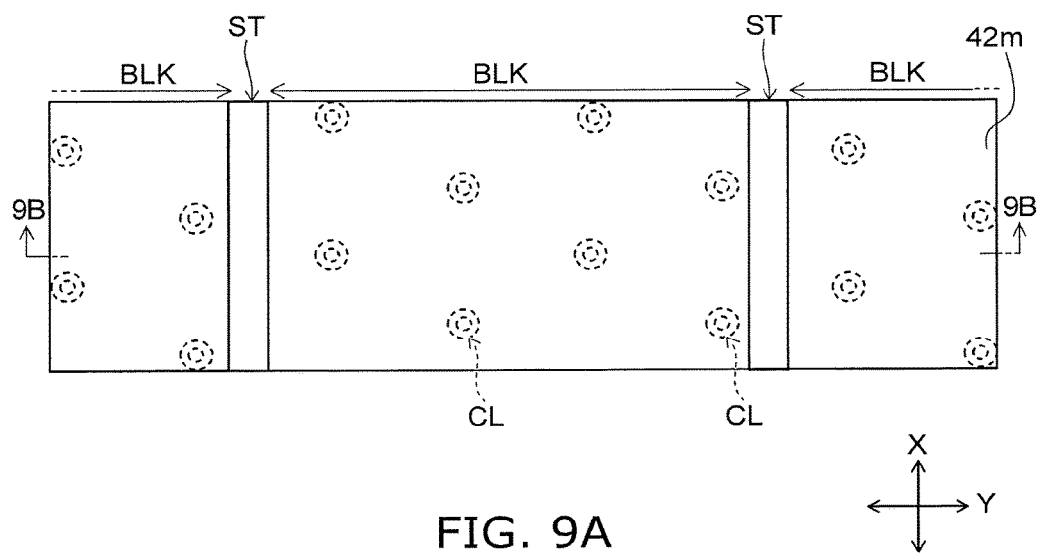
Figure 9B:
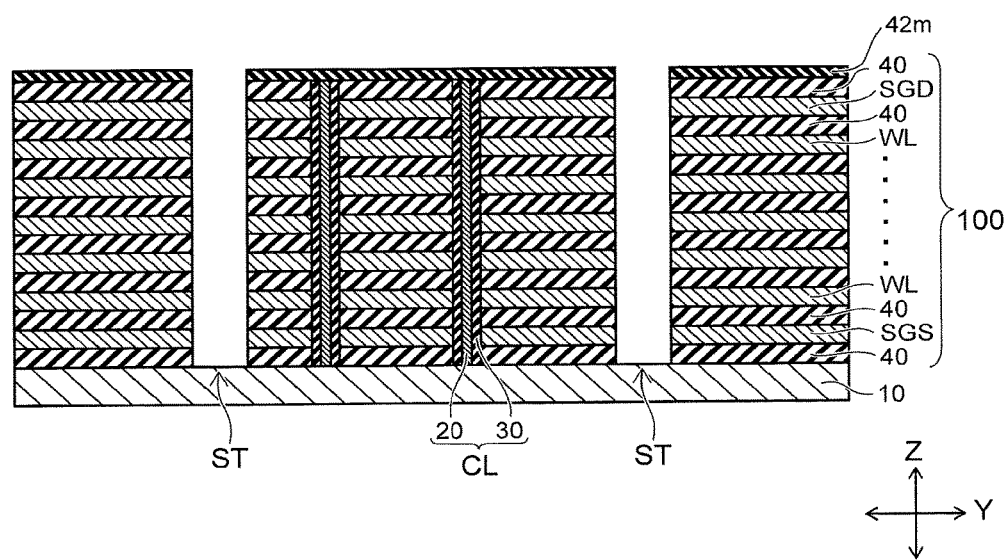

Next, as shown in FIG. 9A and FIG. 9B, the replacement member 41 is removed from the stacked body 100 via the slit ST. After that, the blocking insulating film 35 (FIG. 9B and subsequent drawings not shown) is formed in a portion where the replacement member 41 is removed, and the electrode layer (SGS, WL, SGD) is formed on the blocking insulating film 35. The electrode layer (SGS, WL, SGD) includes, for example, tungsten.

Figure 10A:
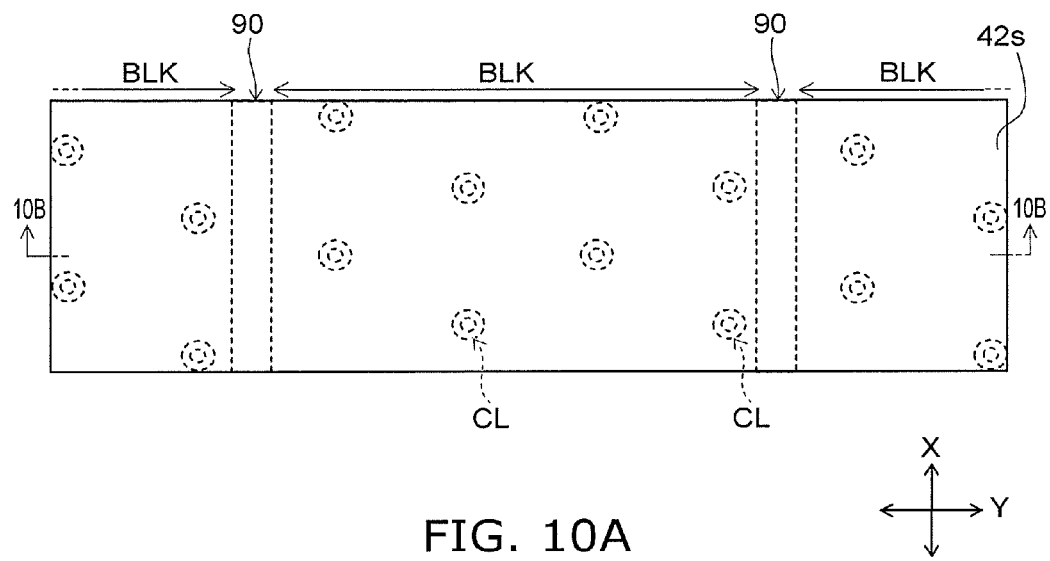
Figure 10B:
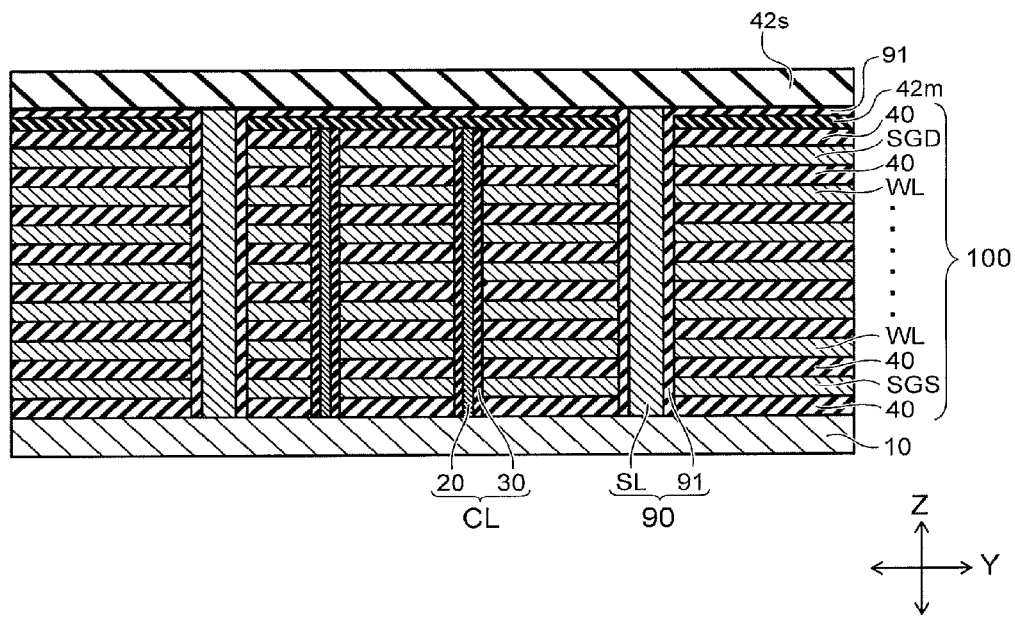

Next, as shown in FIG. 10A and FIG. 10B, an insulating film 91 is formed on a side wall of the slit ST and the insulator 42m. For example, silicon oxide film is selected as the insulating film 91. For example, at least one of CVD method (Chemical Vapor Deposition) or ALD method (Atomic Layer Deposition) using tetrachlorosilane ($SiCl_4$) or tetrafluorosilane ($SiF_4$) is used as the method forming the insulating film 91.

After that, the source line SL is formed on the insulating film 91. For example, tungsten is selected as the source line SL. For example, at least one of CVD method or ALD method using tungsten hexafluoride ($WF_6$) or hexachlorotungsten ($WCl_6$) is used as the method forming the source line SL. Further, the source line SL formed on the slit ST is, for example, removed by CMP method (Chemical Mechanical Polish). Thereby, the side wall portion 90 is formed. After that, the insulator 42s is formed on the insulating film 91. For example, silicon oxide is selected as the insulator 42s.

Figure 11A:
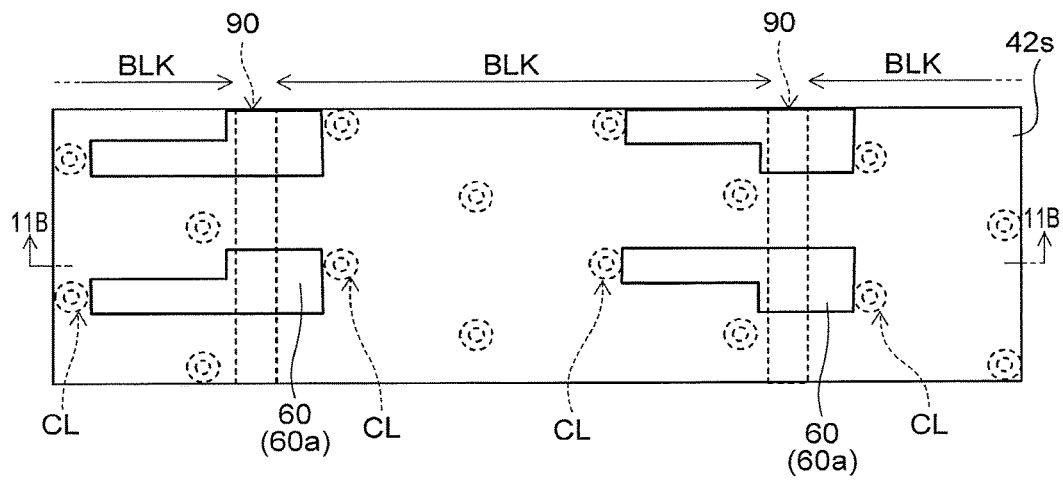
Figure 11B:
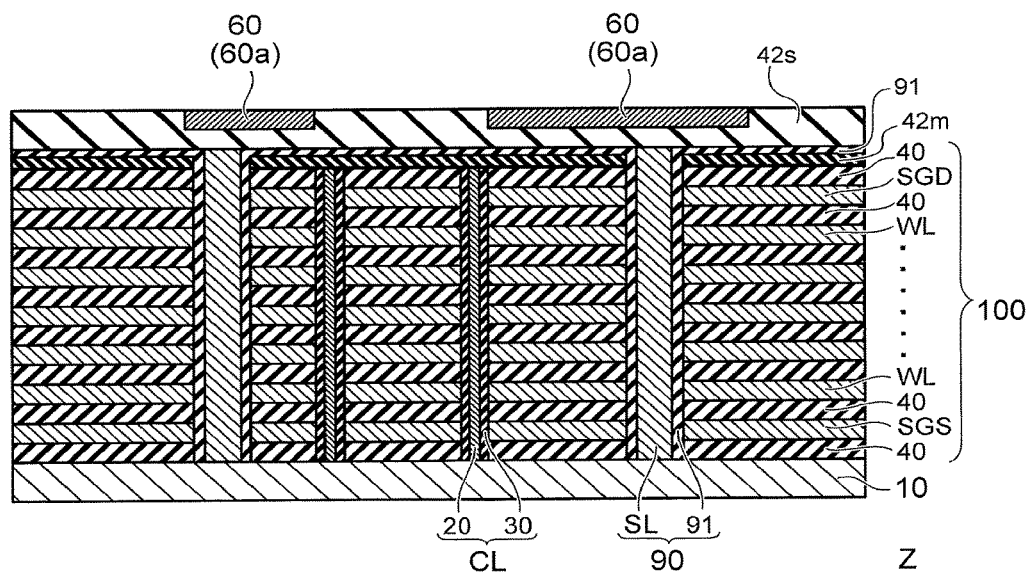

Next, as shown in FIG. 11A and FIG. 11B, the plurality of first intermediate interconnects 60a is formed in the insulator 42s. Each of the first intermediate interconnects 60a extends in the Y-direction and is formed in the hook shaped. For example, at least one of CVD method and ALD method is used as the method forming the first intermediate interconnect 60a. For example, tungsten is selected as the first intermediate interconnect 60a. In the embodiment, interconnects of the peripheral circuit not shown may be simultaneously formed with the first intermediate interconnect 60a. Thus, the first intermediate interconnect 60a may be formed without increasing number of the processes.

Figure 12A:
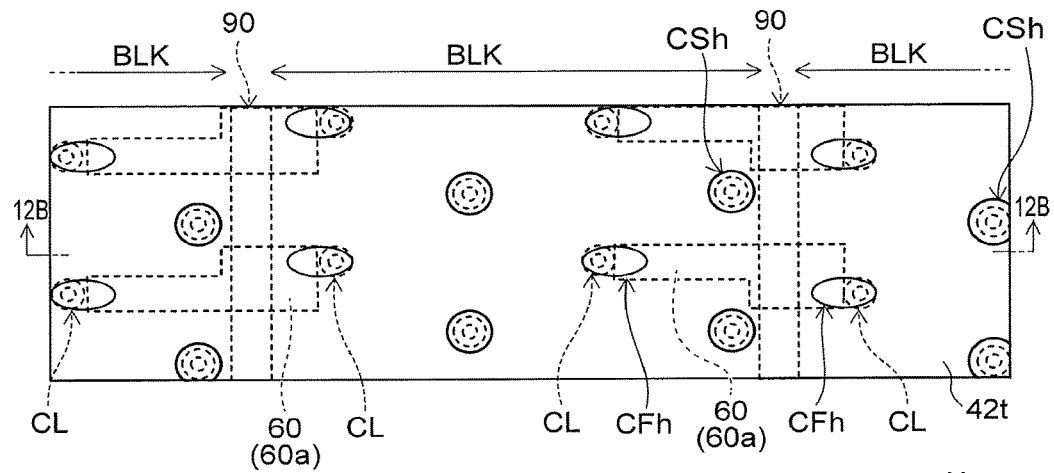
Figure 12B:
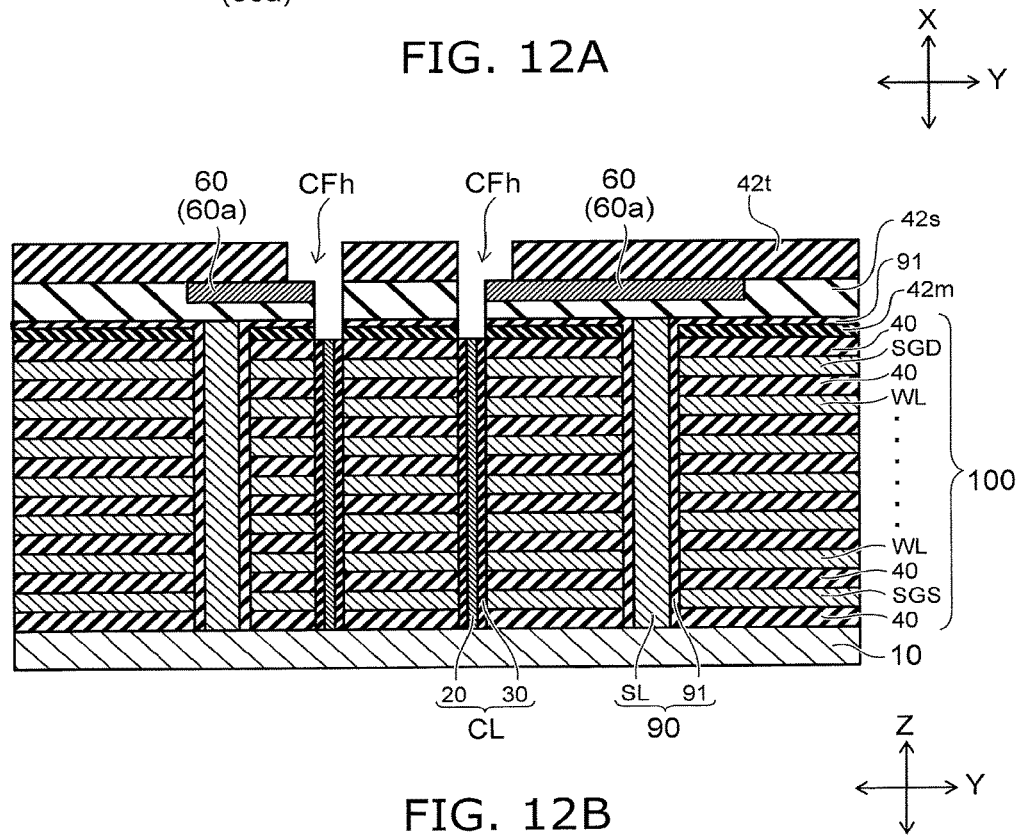

Next, as shown in FIG. 12A and FIG. 12B, the insulator 42t is formed on the first intermediate interconnect 60a and the insulator 42s, and a plurality of first hole CFh and a plurality of second hole CSh are formed in the insulator 42t. Each of the holes CFh, CSh pierces each of the insulators 42t, 42s, 42m and the insulating film 91, and reaches the upper surface of the columnar portions CL. The upper surface and the side surface of the first intermediate interconnect 60a and the upper surface of the columnar portion CL are exposed from the first intermediate interconnect CFh. The first hole CFh is an elliptical configuration at a height higher than the height of the upper surface of the first intermediate interconnect 60a, and is a configuration excluding the area in contact with the upper surface of the first intermediate interconnect 60a from the elliptical configuration at a height not more than the height of the upper surface of the first intermediate interconnect 60a. The upper surface of the columnar portion CL is exposed from the second hole CSh.

In the embodiment, each of the holes CFh, CSh may be simultaneously formed. Thus, compared to the case where each of the holes CFh, CSh is sequentially formed, each of the holes CFh, CSh may be formed by aligning only once. Thereby, the fluctuation of disposing each of the holes CFh, CSh may be suppressed.

Figure 13A:
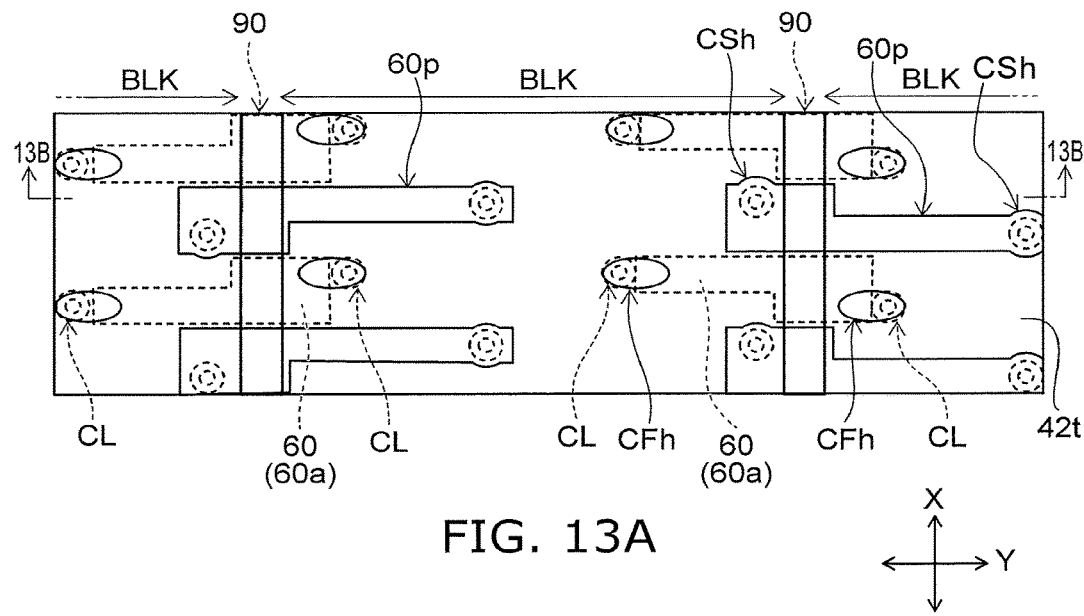
Figure 13B:
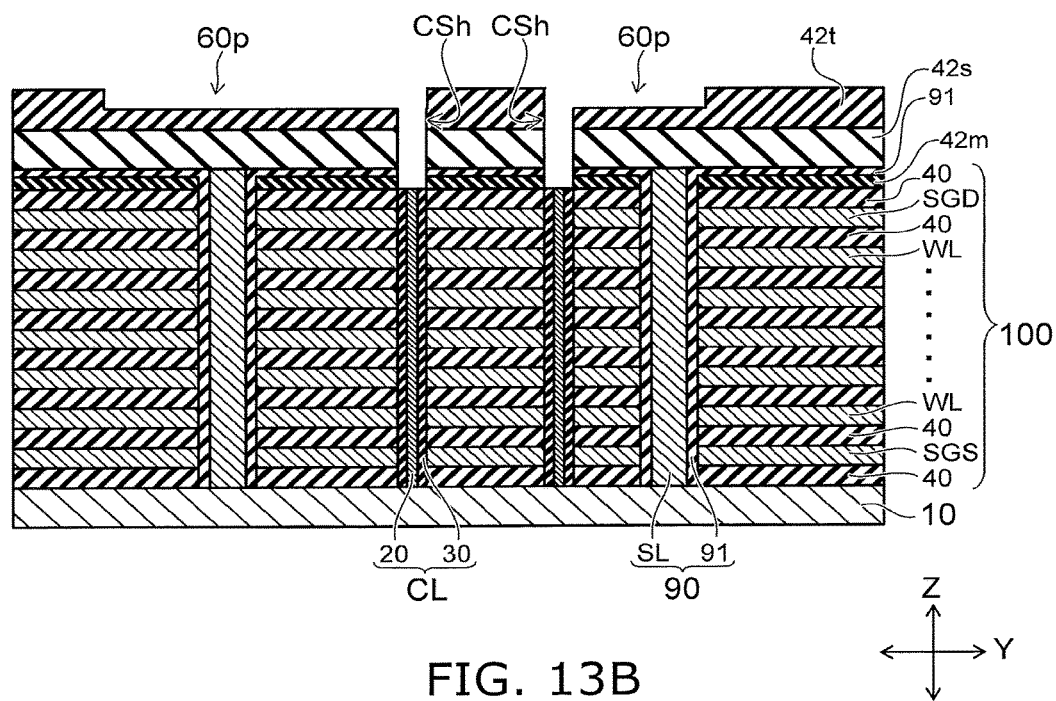

Next, as shown in FIG. 13A and FIG. 13B, a plurality of patterns 60p is formed in the insulator 42t. Each of patterns 60p is formed in the hook shape extending in the Y-direction, and is integrally formed with two second holes CSh. The patterns 60p and the first intermediate interconnects 60a are, for example, alternately formed in the X-direction. The pattern 60p is formed at a height higher than the height of the upper surface of the first intermediate interconnect 60a.

Figure 14A:
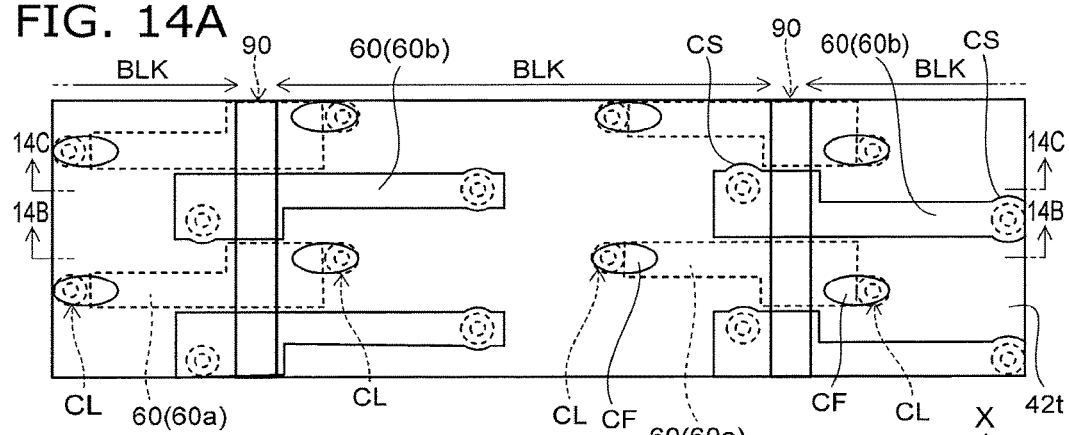
Figure 14B:
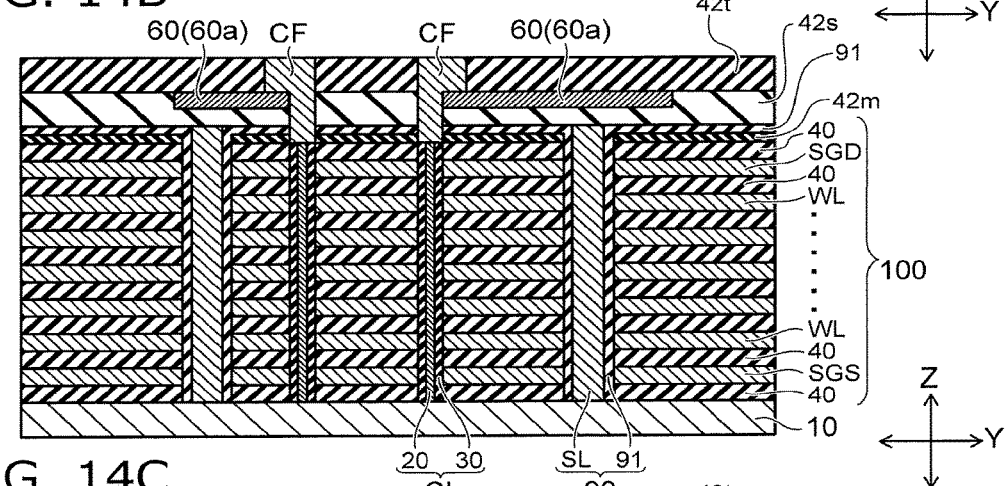
Figure 14C:
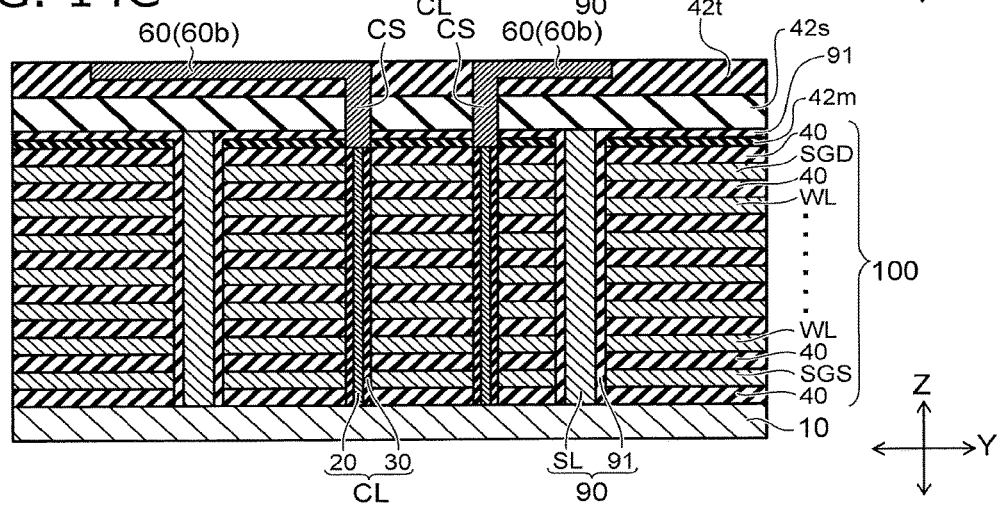

Next, as shown in FIG. 14A to FIG. 14C, a metal film is filled in each of the holes CFh, CSh and the pattern 60p. For example, tungsten is selected as the metal film. For example, at least one of CVD method or ALD method is used as the method forming the metal film. Further, the metal film formed on the insulator 42t is, for example, removed by CMP method. Thereby, the lower layer connection portion CF is formed in the second hole CSh. Further, the upper layer connection portion CS is formed in the second hole CSh, and the second intermediate interconnect 60b is formed in the pattern 60p. The upper layer connection portion CS is integrally formed with the second intermediate interconnect 60b. The lower layer connection portion CF is in contact with the upper surface and the side surface of the first intermediate interconnect 60a and the upper surface of the columnar portion CL. The upper layer connection portion CS is in contact with the upper surface of the columnar portion CL. Therefore, each of the first intermediate interconnects 60a and each of the second intermediate interconnects 60b are electrically connected to two columnar portions CL formed to interpose the side wall portion 90.

In the embodiment, the lower layer connection portion CF may be simultaneously formed with the upper layer connection portion CS, the second intermediate interconnect 60b, and the interconnects of the peripheral circuit not shown. Thus, the lower layer connection portion CF, the upper layer connection portion CS, and the second intermediate interconnect 60b may be formed without increasing number of the processes.

Next, as shown in FIG. 4A, the contact portion Cb is formed on the lower layer connection portion CF and the second intermediate interconnect 60b. In the embodiment, for each of the connections 60a, 60b formed at different heights, each of the contact portions Cba, Cbb equal in height is formed. The lower surface of the second contact portion Cbb is coplanar with the lower surface of the first contact portion Cba. Thus, each of the contact portions Cba, Cbb may be simultaneously formed. Thereby, the number of the processes may be reduced.

Next, as shown in FIG. 5A, the plurality of bit lines BL is formed on the contact portion Cb. The semiconductor device of the embodiment may be, for example, manufactured by such a manufacturing method.

Thus, according to the embodiment, the degree of difficulty of processing of the intermediate interconnect may be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a stacked body including a plurality of electrode layers stacked with an insulator interposed;
   a first interconnect and a second interconnect provided on the stacked body, and extending in a first direction crossing a stacking direction of the stacked body;
   a first columnar portion, a second columnar portion, a third columnar portion, and a fourth columnar portion provided in the stacked body, and extending in the stacking direction;
   a first intermediate interconnect provided between the first interconnect and the stacked body, and extending in the first direction, the first intermediate interconnect electrically connected to the first interconnect, the first columnar portion, and the second columnar portion;
   a first connection portion in contact with the first columnar portion and the first intermediate interconnect;
   a second connection portion in contact with the second columnar portion and the first intermediate interconnect; and
   a second intermediate interconnect provided between the second interconnect and the stacked body, and extending in the first direction, the second intermediate interconnect provided at a height different from a height of the first intermediate interconnect, the second intermediate interconnect electrically connected to the second interconnect, the third columnar portion, and the fourth columnar portion;
   wherein, as viewed from the stacking direction, the first columnar portion, the second columnar portion, the third columnar portion, and the fourth columnar portion are arranged in order of the first columnar portion, the third columnar portion, the second columnar portion, and the fourth columnar portion along the first direction, and in order of the second columnar portion, the first columnar portion, the fourth columnar portion, and the third columnar portion along a second direction crossing the stacking direction and the first direction.

2. The device according to claim 1, wherein
   the second intermediate interconnect is provided at the height higher than the height of the first intermediate interconnect,
   the first connection portion is in contact with an upper surface of the first columnar portion and an upper surface of the first intermediate interconnect, and
   the second connection portion is in contact with an upper surface of the second columnar portion and the upper surface of the first intermediate interconnect.

3. The device according to claim 1, further comprising a side wall portion provided in the stacked body, and extending the stacking direction and the second direction, wherein
   the side wall portion is provided between the second columnar portion and the third columnar portion.

4. The device according to claim 1, wherein
   as viewed from the stacking direction, the first interconnect overlaps the first columnar portion, and is separated from the second columnar portion, and as viewed from the stacking direction, the second interconnect overlaps the fourth columnar portion, and is separated from the third columnar portion.

5. The device according to claim 1, further comprising:
a third connection portion provided between the third columnar portion and the second intermediate interconnect; and
a fourth connection portion provided between the fourth columnar portion and the second intermediate interconnect, wherein
the second intermediate interconnect is integrally provided with the third connection portion and the fourth connection portion.

6. The device according to claim 5, wherein the second intermediate interconnect, the third connection portion, and the fourth connection portion include a material same as a material of the first connection portion and a material of the second connection portion.

7. The device according to claim 5, wherein, as viewed from the stacking direction, the second intermediate interconnect overlaps the third connection portion, the fourth connection portion, the third columnar portion, and the fourth columnar portion.

8. The device according to claim 1, further comprising a first contact portion provided between the first connection portion and the first interconnect, wherein
the first contact portion is in contact with the first connection portion and the first interconnect.

9. The device according to claim 8, further comprising a second contact portion provided between the second intermediate interconnect and the second interconnect, wherein
the second contact portion is in contact with the second intermediate interconnect and the second interconnect, and
a lower surface of the second contact portion is coplanar with a lower surface of the first contact portion.

10. The device according to claim 1, wherein the first columnar portion, the second columnar portion, the third columnar portion, and fourth columnar portion include
a semiconductor body extending the stacking direction, and
a charge storage film provided between the semiconductor body and the stacked body.

11. A device, comprising:
a stacked body including a plurality of electrode layers stacked with an insulator interposed;
a first interconnect provided on the stacked body and extending in a first direction crossing a stacking direction of the stacked body;
a first columnar portion and a second columnar portion provided in the stacked body and extending in the stacking direction, as viewed from the stacked body, the first interconnect overlapping the first columnar portion and separated from the second columnar portion;
a first side wall portion provided in the stacked body, and extending in the stacking direction and in a second direction crossing the stacking direction and the first direction, the first side wall portion provided between the first columnar portion and the second columnar portion; and
a first conductive line provided between the stacked body and the first interconnect, and extending in the first direction, the first conductive line electrically connected to the first interconnect, the first columnar portion, and the second columnar portion;
a second interconnect provided on the stacked body and extending in the first direction;
a third columnar portion and a fourth columnar portion provided in the stacked body, and extending in the stacking direction;
a second side wall portion provided in the stacked body and extending in the stacking direction and the second direction; and
a second conductive line provided between the stacked body and the second interconnect, and extending in the first direction, wherein
as viewed from the stacking direction, the first columnar portion, the second columnar portion, the third columnar portion, and the fourth columnar portion are arranged in order of the first columnar portion, the second columnar portion, the third columnar portion, and the fourth columnar portion along the first direction,
as viewed from the stacking direction, the second interconnect overlaps the third columnar portion, and is separated from the fourth columnar portion,
the second side wall portion is provided between the third columnar portion and the fourth columnar portion,
the second conductive line is electrically connected to the second interconnect, the third columnar portion, and the fourth columnar portion,
as viewed from the stacking direction, the first interconnect overlaps the fourth columnar portion, and is separated from the third columnar portion, and
as viewed from the stacking direction, the second interconnect overlaps the second columnar portion, and is separated from the first columnar portion.

12. A device comprising:
a stacked body including a plurality of electrode layers stacked with an insulator interposed;
a first interconnect provided on the stacked body and extending in a first direction crossing a stacking direction of the stacked body;
a first columnar portion and a second columnar portion provided in the stacked body and extending in the stacking direction, as viewed from the stacked body, the first interconnect overlapping the first columnar portion and separated from the second columnar portion;
a first side wall portion provided in the stacked body, and extending in the stacking direction and in a second direction crossing the stacking direction and the first direction, the first side wall portion provided between the first columnar portion and the second columnar portion; and
a first conductive line provided between the stacked body and the first interconnect, and extending in the first direction, the first conductive line electrically connected to the first interconnect, the first columnar portion, and the second columnar portion;
a second interconnect provided on the stacked body and extending in the first direction;
a third columnar portion and a fourth columnar portion provided in the stacked body, and extending in the stacking direction;
a second side wall portion provided in the stacked body and extending in the stacking direction and the second direction; and
a second conductive line provided between the stacked body and the second interconnect, and extending in the first direction, wherein as viewed from the stacking direction, the first columnar portion, the second columnar portion, the third columnar portion, and the fourth columnar portion are arranged in order of the first columnar portion, the second columnar portion, the third columnar portion, and the fourth columnar portion along the first direction, as viewed from the stacking direction, the second interconnect overlaps the third columnar portion, and is separated from the fourth columnar portion, the second side wall portion is provided between the third columnar portion and the fourth columnar portion, the second conductive line is electrically connected to the second interconnect, the third columnar portion, and the fourth columnar portion, and wherein the second conductive line is provided at a height different from a height of the first conductive line.

13. The device according to claim 11, further comprising:
a first connection portion in contact with an upper surface of the first conductive line and an upper surface of the first columnar portion; and
a second connection portion in contact with the upper surface of the first conductive line and an upper surface of the second columnar portion, wherein
the first conductive line is provided at a height lower than a height of the second conductive line.

14. The device according to claim 11, wherein the first columnar portion and the second columnar portion include
a semiconductor body extending in the stacking direction, and
a charge storage film provided between the semiconductor body and the stacked body.

15. A method for manufacturing a semiconductor device, comprising:
forming a stacked body including a plurality of members stacked with an insulator interposed;
forming a first columnar portion, a second columnar portion, a third columnar portion, and a fourth columnar portion in the stacked body, the first columnar portion, the second columnar portion, the third columnar portion, and fourth columnar portion extending in a stacking direction of the stacked body, as viewed from a stacking direction of the stacked body, the first columnar portion, the second columnar portion, the third columnar portion, and the fourth columnar portion being arranged in order of the first columnar portion, the third columnar portion, the second columnar portion, and the fourth columnar portion along a first direction crossing in the stacking direction, and in order of the second columnar portion, the first columnar portion, the fourth columnar portion, and the third columnar portion along a second direction crossing the stacking direction and the first direction;
forming a first intermediate interconnect on the stacked body, the first intermediate interconnect extending in the first direction;
forming a first connection portion and a second connection portion in contact with an upper surface of the first intermediate interconnect, the first connection portion in contact with the first columnar portion, the second connection portion in contact with the second columnar portion;
forming a second intermediate interconnect at a height higher than a height of the first intermediate interconnect, the second intermediate interconnect extending in the first direction, the second intermediate interconnect electrically connected to the third columnar portion and the fourth columnar portion; and
forming a first interconnect and a second interconnect at a height higher than a height of the second intermediate interconnect, the first interconnect and the second interconnect extending in the first direction, the first interconnect electrically connected to the first intermediate interconnect, the second interconnect electrically connected to the second intermediate interconnect.

16. The method according to claim 15, wherein the forming of the first connection portion and the second connection portion is performed simultaneously with the forming of the second intermediate interconnect.

17. The method according to claim 15, wherein the forming of the first interconnect includes, as viewed from the stacking direction, forming the first interconnect at a portion overlapping the first columnar portion and separated from the second columnar portion, and
the forming of the second interconnect includes, as viewed from the stacking direction, forming the second interconnect at a portion overlapping the fourth columnar portion and separated from the third columnar portion.

* * * * *